United States Patent
Wilcox

[11] 4,131,850
[45] Dec. 26, 1978

[54] SINGLE SIDE BAND RADIO APPARATUS

[76] Inventor: Glade Wilcox, 1407 Knollwood Ave., Kalamazoo, Mich. 49007

[21] Appl. No.: 769,899

[22] Filed: Feb. 18, 1977

[51] Int. Cl.$^2$ .............................................. H04B 1/66
[52] U.S. Cl. .................................... 325/137; 325/145; 332/16 R; 332/45
[58] Field of Search ............... 325/135, 138, 139, 136, 325/137, 50, 49; 332/16, 17, 44, 45

[56] References Cited

U.S. PATENT DOCUMENTS

| | | | |
|---|---|---|---|
| 3,588,702 | 6/1971 | Tisi | 325/137 |
| 3,701,852 | 10/1972 | Sluijter et al. | 325/50 |
| 3,714,577 | 1/1973 | Hayes | 325/137 |
| 3,795,865 | 3/1974 | Armstrong | 325/137 |
| 3,803,490 | 4/1974 | Almering et al. | 325/49 |
| 4,025,855 | 5/1974 | Atkinson | 325/137 |

*Primary Examiner*—Robert L. Griffin
*Assistant Examiner*—Tommy P. Chin
*Attorney, Agent, or Firm*—Blanchard, Flynn, Thiel, Boutell and Tanis

[57] ABSTRACT

A radio transmitter, or transceiver, provides for single side band transmission. A first carrier frequency source provides a first carrier frequency (term the deleted carrier) for balanced modulation by at least one balanced modulator. The resulting side band signal is ultimately applied to an add mixer along with a second carrier. The add mixer ultimately feeds a subtract mixer which also receives the deleted carrier frequency and subtracts same from the side band sum signal from the add mixer to provide the side band signal at the second carrier frequency, i.e., with the first carrier deleted. Alternative embodiments provide for single side band generation by use of a band pass filter following the balanced modulator or use of double balanced modulators with phase shift networks coupling the deleted carrier source and a source of modulating signals thereto. In a further embodiment, a phase lock loop synthesizer is employed for generating one of said carrier signals. In a preferred embodiment, the single side band transmission is built into an AM transmitter, or transceiver, to use the modulating signal source and basic AM carrier source (as the source of the second carrier of the side band system) and the transmitter output amplification portions thereof. Also in such a preferred embodiment, a substantial selection of output frequencies is provided by mixing of the carrier frequency outputs of a pair of crystal controlled oscillators each with several alternatively selectable crystals in the AM portion of the transmitter, wherein the deleted carrier source in the side band portion of the transmitter incorporates a pair of crystals tuned to upper and lower frequencies and permitting alternative selection of upper and lower side bands for each of the several synthesized AM transmit frequencies.

15 Claims, 5 Drawing Figures

SINGLE SIDE BAND RADIO APPARATUS

FIELD OF THE INVENTION

This invention relates to a radio transmitter or transceiver, and more particularly to such a transmitter or transceiver including signle side band transmission capability.

BACKGROUND OF THE INVENTION

A typical prior art method of single side band generation, which may be a filtering method, applies a modulating signal to a first carrier frequency via a balanced modulator, then filters the result to provide a single side band signal which is then mixed by adding to a second carrier frequency to obtain, as a desired output, a single side band signal at the sum of the two carrier frequencies.

Another prior art method of single side band generation involves phasing of first carrier and modulating frequencies to cancel out the carrier in one of the side bands and mixing the resulting side band signal by addition with a second carrier frequency to obtain, as the desired output, a side band signal at the sum of the two carrier frequencies.

Another prior art method has involved balanced modulation and add mixing to obtain the desired frequency, followed by either filtering or phasing out of the carrier in one side band before applying the generated single side band signal to a linear amplifier for output. In this latter method the output signal is the side band frequency of the carriers.

Thus, in summary, prior known methods of single side band generation have utilized the first carrier signal as an integral part of the output frequency of the single side band generator. Thus, single side band transmitters utilizating sum frequencies carry the distortion (frequency, phase, and inter-carrier) that exists on the first carrier, or because of such first carrier, into the linear amplifier for amplification and transmission.

The objects of this invention include provision of single side band apparatus to remove the first carrier frequency from the generated and filtered side band frequency after the signal has been mixed with a second radio frequency to obtain what would normally be the single side band output frequency.

A further object of this invention is to provide an apparatus as aforesaid for thus eliminating distortion due to the first carrier, and to permit the use of CW/AM frequencies of a transmitter, without frequency modifications, for side band operation.

Other objects and purposes of this invention will be apparent to persons acquainted with apparatus of this general type upon reading the following specification and inspecting the accompanying drawings.

SUMMARY OF THE INVENTION

The objects and purposes of the invention are met by providing a radio transmitter, or transceiver, for single side band transmission. A first carrier frequency source provides a first carrier frequency (term the deleted carrier) for balanced modulation by at least one balanced modulator. The resulting side band signal is ultimately applied to an add mixer along with a second carrier. The add mixer ultimately feeds a subtract mixer which also receives the deleted carrier frequency and subtracts same from the side band sum signal from the add mixer to provide the side band signal at the second carrier frequency, i.e., with the first carrier deleted. Alternative embodiments provide for single side band generation by use of a band pass filter following the balanced modulator or use of double balanced modulators with phase shift networks coupling the deleted carrier source and a source of modulating signals thereto. In a further embodiment, a phase lock loop synthesizer is employed for generating one of said carrier signals. In a preferred embodiment, the single side band transmission is built into an AM transmitter, or transceiver, to use the modulating signal source and basic AM carrier source (as the source of the second carrier of the side band system) and the transmitter output amplification portions thereof. Also in such a preferred embodiment, a substantial selection of output frequencies is provided by mixing of the carrier frequency outputs of a pair of crystal controlled oscillators each with several alternatively selectable crystals in the AM portion of the transmitter, wherein the deleted carrier source in the side band portion of the transmitter incorporates a pair of crystals tuned to upper and lower frequencies and permitting alternative selection of upper and lower side bands for each of the several synthesized AM transmit frequencies.

DETAILED DESCRIPTION

Figure 1:
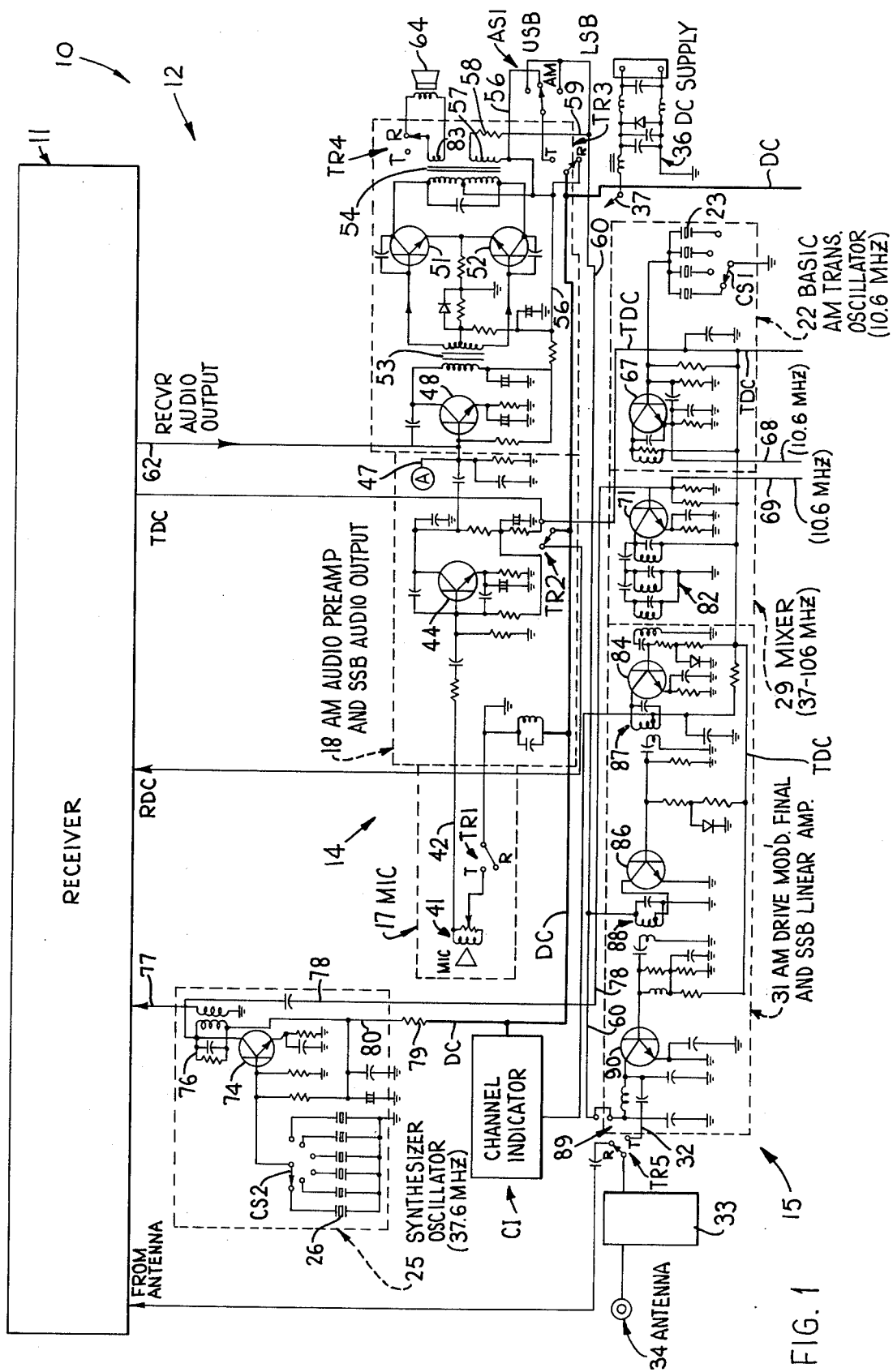
FIG. 1 is a block and schematic diagram of a transceiver, with the AM transmit portion thereof schematically disclosed, and which is adaptable to single side band transmission in accord with the present invention.

FIG. 1 discloses a transceiver 10 adaptable to single side band transmission in accord with the present invention. The transceiver 10 incorporates a conventional receiver portion 11 capable of AM (amplitude modulation) and SSB (single side band) reception, which in view of its conventional nature is simply shown as a single block. The transceiver 10 also includes a transmit portion 12 capable of AM transmission but also adapted in accord with the present invention for single side band transmission as hereinafter discussed. The particular transmit circuitry 12 shown in FIG. 1 is of course merely shown as an example of AM transmission circuitry aspects of the present invention, and is shown here to better illustrate the present invention.

The AM transmit path, from microphone to antenna, may be conventional, but the AM transmit path through transmitter portion 12 in FIG. 1 is shown and discussed below in some detail to insure complete understanding of the invention.

The transmit path of transmit portion 12 thus includes, generally speaking, an audio section 14 and a radio frequency section 15. The audio frequency section 14 includes a microphone block 17 actuable to drive an AM audio pre-amp block 18, which in turn drives an AM transmit modulator driver-final 20.

The radio frequency section 15 here comprises a basic AM transmit oscillator 22, which, to permit transmission alternatively on any of several precisely selectable frequencies, or channels, has its output frequency controlled by several (here four) switch selected crystals 23. In the embodiment shown, the number of available transmit channels are substantially multiplied by additionally incorporating in the transmit section 15 a synthesizer oscillator 25, which in the embodiment shown contains its own plurality (here six) of switch selectable crystals 26. For example, to employ the transceiver 10 on the Citizens Band, oscillator 22 may for example employ crystals 23 cut near 10.6 MHz and oscillator 25 may employ crystals cut near 37.6 MHz, such that upon application of signal from each oscillator to a synthesizer mixer 29 of subtraction type, a difference radio frequency is produced. Thus by appropriate switching of the crystals 23 and 26 any one of the 23 citizens band channels (in the 27MHz frequency range) can be selected and appear at the output of synthesizer mixer 29. The synthesizer mixer 29 supplies the carrier frequency for an AM drive modulated-final 31 which is also supplied its audio frequency modulating signal from AM transmit modulator 20. AM final 31 thus provides an amplitude modulated carrier signal at its output line 32 for amplication, as through suitable filtering 33 if desired, to an antenna 34.

Reviewing the transmit portion 12 here shown, in a bit more detail, same receives operating potential from a regulated DC power supply 36 through an on-off switch 37 and a DC supply line, here labeled DC.

The microphone unit 17 includes a conventional microphone 41 connected across the input of the AM audio pre-amp 18 by a line 42 and the selectable transmit contact T of a manually actual transmit receive switch TR1.

The AM audio pre-amp 18 comprises a transistor 44 receiving microphone audio signals at its base from line 42 and obtaining DC operating potential by a connection of it collector through series resistors to the selectable transmit contact of a further transmit receive switch TR2 connected to the operating potential line DC. It will be understood that the several transmit receive switches TR hereindiscussed are preferably mechanically coupled by means not shown for simultaneous selection of the transmit or receive mode of the apparatus. The amplified microphone audio is taken from the collector of transistor 44 and applied both to a line 47 (connected to single side band circuitry hereinafter described) and to the base of the input transistor 48 of the AM transmit modulator driver-final 20. If desired, the last mentioned transmit receive switch TR2 may at its transmit contact also connect to a switch power supply line TDC energized by such switch only in the transmit mode of the apparatus and, if desired, coupled to the receiver 11.

The AM transmit modulator 20 further includes a push-pull pair of transistors 51 and 52, the bases of which are transformer driven at 53 from the collector of input transistor 48, and the collectors of which drive audio output transformer 54. Operating potential from line DC is applied through the transmit contact T of a third transmit receive switch TR3 and thence through the AM contact of the an AM-side band selection switch AS1 and line 56 to supply collector potential to input transistor 48 through the primary of transformer 53, and to the collectors of transistors 51 and 52 through the center tapped primary of transformer 54, as well as to apply base bias to such transistors as shown. Transformer 54 includes an AM transmit secondary winding 57 which applies the audio modulating signal from the push-pull transistor pair 51, 52 through a resistor 58 and series line 59 and 60 to the output stages of AM final 31 as hereafter discussed for amplitude modulating the carrier signal in the AM mode of the transmitter. Line 60 also receives the DC operating potential from line DC in transmit mode, either directly through contacts SB of switch AS1 or indirectly through contacts AM of switch AS1 and path 56, 57, 58, 59.

In the embodiment shown, the AM modulator 20 also serves as the audio output stage in the receive mode of the transceiver. More particularly, in the receive mode, the detected audio signal from receiver 11 is applied through a line 62 to the base of input transistor 48 which through push-pull transistors 51, 52 drives a further secondary winding 63 of audio output transformer 54. The audio secondary 63 then drives a suitable audio transducer (e.g. loud speaker) 64 through the receive contact R of a fourth transmit receive switch TR4. Also in receive mode, DC may be supplied to parts of receiver 11 by switch TR2 through a line RDC.

In the embodiment shown, basic AM transmit oscillator 22 comprises the mentioned crystals 23 and channel selector switch CS1 actuable to selectably couple the latter to the base of an oscillator transistor 67 whose approximately 10.6 MHz RF output is taken from the collector tank circuit of transistor 67 and applied through line 68 and 69 which in the AM transmit mode are connected by switching hereafter described in connection with FIG. 2.

Line 69 applies the basic AM transmitter oscillator frequency to the base of a transistor 71 in mixer 29.

Synthesizer oscillator 25 includes a transistor 74, the base of which is coupled selectably through a crystal selection switch CS2 to the desired one of the crystals 26, and the collector which drives a tank circuit 76. If desired the synthesizer oscillator 25 may be used to provide RF signals (e.g. in the 37.6 MHz range) to the receiver, as indicated by line 77, where the received channels are generated by a synthesis method as in the transmitter 12. However, the synthesizer RF signal for transmit purposes is also taken from the tank 76 and applied through a line 78 also to the base of mixer transistor 71. Collector operating potential and base bias are supplied to transistor 74 through DC potential line DC, a resistor 79 and a line 80 in a conventional manner.

The collector of mixer transistor 71 is inductively coupled through a triple tuned tank network 82 to the base of an input amplifier transistor 84 of the Am drive modulated final 31, to apply the synthesized RF carrier, for example in the 27 MHz band, to the final 31. To permit use of the final 31 for output amplification of single side band signals generated as hereafter described with respect to FIG. 2, the final 31 is constructed as a linear amplifier and will be so named hereafter. The linear amplifier 31 further includes a driver transistor 86 which is coupled through tank, or tuned circuit, 87 to the collector of pre-amp transistor 84, and whose collector in turn is similarly tank coupled at 88 to the base of final amplifier transistor 90. In the AM transmit mode, the modulating audio signal on line 60 is applied to the collector circuits 88 and 89 of transistors 86 and 90 for amplitude modulating the approximately 27 MHz RF signal applied to the base of pre-amplifier transistor 84. The collector of final amplifier transistor 90 is then coupled as shown through path 32 and the selectable transmit contact T of fifth transmit receive switch TR5, here through a suitable network (e.g. a pi network) 33 to drive the antenna 34 for transmitting an amplitude modulated RF carrier signal.

DC operating potential is applied to transistors 67, 71, 84, 86 and 90 from a branch of above-mentioned line TDC (energized from the transmit contact T of transmit receive switch TR2). In both AM and SB modes, the DC potential superposed on line 60 appears on the collector circuits of transistors 86 and 90.

The various resistors, capacitors, inductors, diodes, etc. shown in the above-discussed blocks of FIG. 1 are conventionally connected with the transistors and in the signal DC operating potential paths above-described, for operation of the described circuit blocks in a conventional manner, and themselves thus require no further discussion. If desired a conventional channel indicator CI may be supplied operating potential as needed and coordinated with channel switches CS1 and CS2 by any means not shown.

Figure 2:
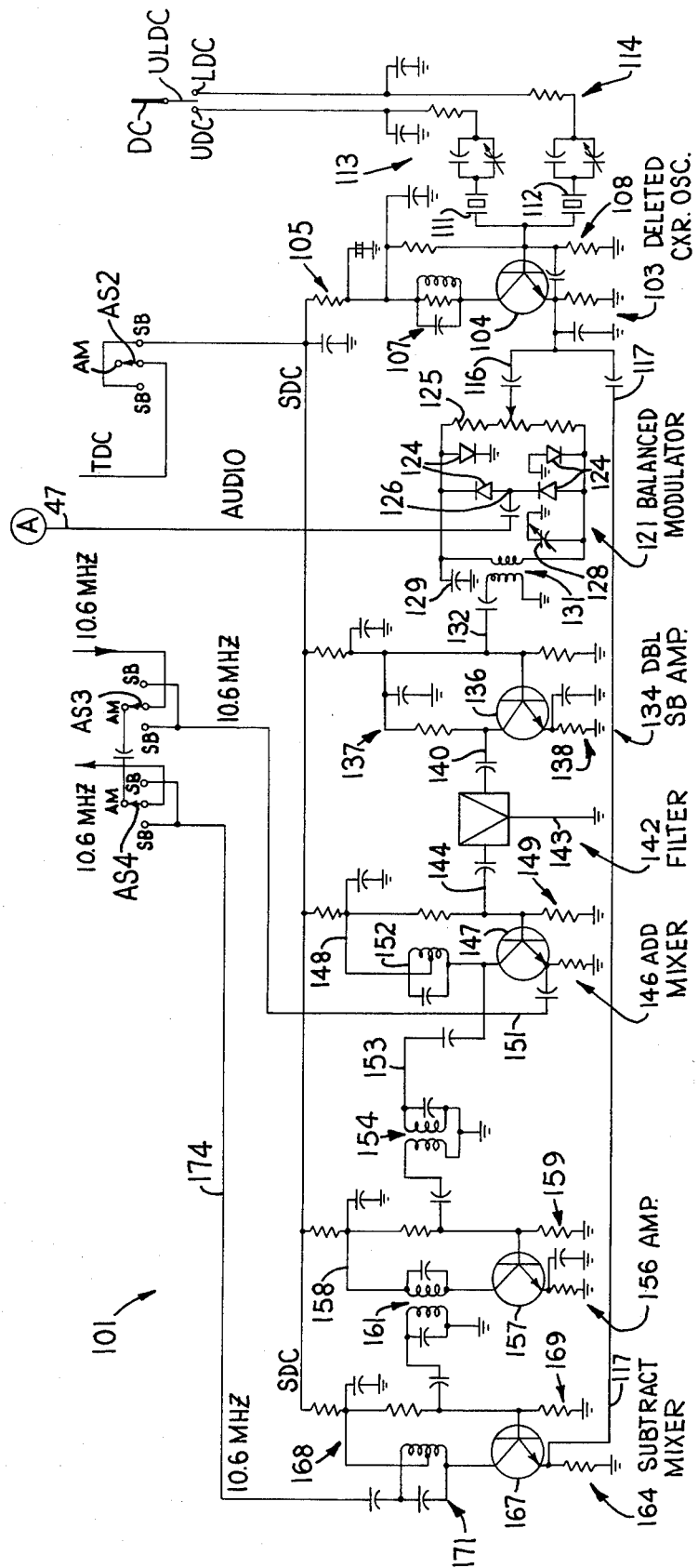
FIG. 2 schematically discloses deleted carrier single side band generation circuitry according to the present invention and which is connectable with the FIG. 1 transceiver to share portions of the transmit circuitry thereof.

FIG. 2 discloses single side band generating circuitry 101 for providing a deleted carrier single side band output signal. Operating potential for the side band circuitry 101 is obtained from the transmit mode operating potential supply line TDC (from switch TR2 in FIG. 1) and a further AM-side band selector switch AS2. Additional AM-side band switches AS3 and AS4 are discussed hereinafter. All of the AM-side band switches AS1 through AS4 are mechanically ganged for simultaneous switching and alternatively select between AM and SB (side band) contacts. Switch AS2 merely is a dummy AM contact but when thrown to its side band contact SB couples the transmit operating potential line TDC to supply operating potential to the line SDC of side band circuitry 101. Accordingly, operation of the side band circuitry requires operator selection of both the transmit and side band modes to energize line SDC and thereby the side band circuit 101.

Side band circuit 101 includes a deleted carrier oscillator 103 including a transistor 104. In the embodiments shown, transistor 104 receives operating potential from line SDC through a path 105 including a tank, or tuned circuit 107, has a suitable RC network 108 for base and emitter biasing as shown and alternatively selectable upper and lower side band crystals 111 and 112 connected to the base thereof. Thus, the deleted carrier oscillator 103 functions as a transistor crystal oscillator. For the sake of illustration, a nominal 7.8 MHz deleted carrier frequency may be employed, with a 1.5 KHz frequency displacement provided with an upper side band crystal 111 cut at 7.7985 MHz and a lower side band crystal 112 cut at 7.8015 MHz.

To select between the upper and lower side bands, an upper-lower side band selector switch ULDC connected to the operating potential supply line DC (from FIG. 1) is shiftable from one to the other of contacts UDC and LDC, respectively connected through adjustable capacitance and resistance networks 113 and 114 to the crystals 111 and 112 respectively. Thus, for example, setting switch ULDC at contact UDC causes oscillator 103 to produce a RF signal at the frequency to which crystal 111 is cut, here slightly below the nominal 7.8 MHz deleted carrier frequency.

The output of the deleted carrier oscillator 103 is taken from the emitter of transistor 104 through capacitance coupling lines 116 and 117.

The former provides deleted carrier RF drive to a balanced modulator circuit 121 for modulation by the audio frequency modulating signal appearing on line 47, which as above-discussed is taken from the output of audio circuit 18 of FIG. 1. Note that in the side band mode of operation, circuit 18 serves as the single side band audio output circuit, being supplied with DC operating potential from transmit receive switch TR2 just as in the AM mode, but that AM transmit modulator circuit 20 is in the side band mode deprived of operating potential by breaking of the DC potential connection to line 56 at AM-side band selector switch AS1. Again in the side band transmit mode, switch AS1 instead provides DC operating potential on above-discussed line 60, thereby applying such DC operating potential to the collector circuits of linear amplifier transistors 86 and 90, such that transistor 86 no longer serves an AM-RF modulating function but merely provides an intermediate stage for linear amplification as hereafter discussed. As in the AM mode, transistors 67, 71 and 84 still receive DC operating potential from switch TR2 in its transmit position.

Returning to FIG. 2, the balanced modulator 121 comprises four diodes 124 connected in a ring modulator, with a resistance voltage divider 125 connected thereacross and capacitor coupled to deleted carrier output line 116. The audio line 47 is capacitor coupled to the ring modulator diodes 124 at 126. The upper and lower ends of the balanced modulator diode array 124 are capacitor coupled to ground as indicated at 128 and 129 and output is taken across the balanced modulator through a coupling transformer 131 capacitance coupled to the input line 132 of a double side band amplifier 134. The resultant output on line 132 is a double side band signal, here for example swinging 1.5 KHz on either side of the frequency of the selected crystal 111 or 112, in the case of crystal 111 a span of from 7.7970 to 7.8 MHz.

The double side band amplifier 134 here comprises an RF amplifier transistor 136 supplied operating potential through its base-collector circuit 137 (including current limiting resistors and grounded by-pass capacitors connected as shown) from the operating potential line SDC. The transistor 136 has a base emitter circuit 138 with grounded base and emitter resistors and by-pass capacitor as shown. The amplifier transistor 136 is driven at its base from balanced modulator output line 132 and in turn is capacitor coupled at its collector through line 140 to a band pass filter (here a single side band ceramic filter) 142 grounded at 143. In the example above given, the filter 142 has a narrow band pass region centered on 7.8 MHz with an effective band pass of about 1.5 KHz. With crystal 111 actuated, the capacitor coupled output line 144 of filter 142 would carry a single side band frequency (the upper side band derived from crystal 111) of 7.7985 to 7.8000 MHz.

An add mixer 146 comprises a transistor 147 supplied operating potential by way of having its base-collector circuit 148 (comprising current limiting resistors and a by-pass capacitor to ground as shown) connected to the operating potential line SDC and its base and emitter resistance coupled to ground as generally indicated in base emitter circuit 149. The aforementioned single side band signal (in this example at a nominal 7.8 MHz frequency) from the filter 142 is capacitor coupled through aforementioned line 144 to the base of add mixer transistor 147).

In the single side band mode of the apparatus, a second RF frequency (for example a nominal 10.6 MHz) signal is capacitor coupled through a line 151 to the emitter of add mixer transistor 147 with the help of a tuned LC tank circuit 152 connected to the collector of add transistor 147, in the base collector circuit 148, which tank 152 is tuned to the nominal sum frequency (about 18.2 MHz in this example) of the single side band signal on line 144 and second RF signal on line 151. The add mixer transistor 147 has such sum signal taken from its collector and capacitor coupled through a line 153 and a further tuned (to the sum frequency of about 18.2 MHz) circuit 154 to the input of RF amplifier 156.

Tuned amplifier 156 includes an amplifier transistor 157 which receives operating potential from line SDC through its base collector circuit 158 (incorporating current limiting resistors and a by-pass capacitor to ground as shown. The base and emitter of transistor 157 are coupled to ground through the base-emitter circuit 159, incorporating resistors and a by-pass capacitor as shown. The single side band sum signal from tuned circuit 154 is applied to the base of amplifier transistor 157 whose collector supplies the amplified version thereof through inductively coupled tank circuitry 161 (tuned to the single side band sum frequency, here for example a nominal 18.2 MHz frequency) and thence to the input side of a subtract mixer 164. The latter includes a subtract mixing amplifier transistor 167 having a base collector circuit 168 (comprising current limiting resistors and a grounded by-pass capacitor) connected to the potential line SDC for supplying operating potential to such transistor. Transistor 167 has its base and emitter coupled to ground through resistors at generally indicated at 169. Subtraction is obtained by coupling the base of transistor 167 to the nominal single side band sum signal (e.g. 18.2 MHz approximately) from tank 161 and connecting its emitter to line 117 to receive the deleted carrier RF signal thereon (here for example a nominal 7.8 MHz). As a result, the subtract mixer transistor 167 carries on its collector a single side band signal with the original carrier frequency deleted, i.e. a single side band signal at the second RF frequency obtained from line 151 (here for example a single side band signal at a nominal 10.6 MHz frequency). Such deleted carrier single side band output is taken from the collector of transistor 167 through an appropriately tuned LC tank circuit 171 in the base collector circuit 168 and is capacitively coupled through a line 174 to selectable side band contacts SB of the aforementioned AM-side band selector switch AS4.

In the embodiment shown, switches AS3 and AS4 in their AM position capacitively couple basic AM transmitter oscillator output line 68 to input line 69 of synthesizer mixer 29 (thus handling the non-modulated RF signal at the selected frequency of the oscillator 22, a nominal 10.6 MHz for example). On the other hand, in their side band position, switches AS3 and AS4 respectively couple the basic AM transmit oscillator output line 68 to side band add mixer input line 151 and couple the single side band sum signal output line 174 to the input line 69 of the synthesizer mixer 29.

Accordingly, in the single side band mode of the apparatus, the single side band signal, with the original carrier from oscillator 103 deleted, is applied through line 69 to the base of synthesizer mixer transistor 71, along with the nominal 37.6 MHz synthesizer carrier signal, to produce a difference single side band signal (here for example at about 27 MHz). The latter is fed through the stages 84, 86 and 90 of unit 31, which acts as a linear amplifier, and switch TR5 to drive the antenna 34 with the single side band RF signal (e.g. at about 27 MHz).

It will be understood that the particular single side band channel is selectable first as in the AM mode by selection of the desired one of the twenty-three channels available from selection of combinations of the crystals 23 and 26 in the basic and synthesizer oscillators 22 and 25, and second by use of switch ULDC to select either the side band crystal 111 or side band crystal 112. Thus, in terms of number of crystals required, the side band unit of FIG. 2 by addition of only two more crystals (111 and 112) to the ten already present in the AM circuitry of FIG. 1) in effect adds forty-six more channels (side band) to the transmit capability of the particular twenty-three channels AM transmitter as shown.

The present invention provides a particularly advantageous way in which to combine single side band and normal amplitude modulation transmission capabilities in a single transmitter or transceiver by maximizing the dual use (for both AM and single side band) of circuitry blocks in the transmitter, and thereby minimizing the total number of circuitry blocks required to carry out both AM and single side band transmission. In the particular embodiment of FIGS. 1 and 2, where transmission frequencies are crystal controlled, the present invention likewise minimizes the number of crystals required while permitting alternative selection of a much larger number of channels (e.g. sixty-nine channels with twelve crystals). Also to be noted is that with the present invention an AM only transmitter, like that of FIG. 1, can be readily adapted to single side band transmission with minimum additional circuitry (assuming the RF final 31 has a linear amplification characteristic) by making almost full use of the entire AM transmit circuitry (here excluding the AM transmit modulator driver 20). Substantial flexibility is permitted in the selection of the filter frequency (i.e. the nominal frequency of deleted carrier oscillator 103, filter 142, etc., e.g. a nominal 7.8 MHz), since such first RF frequency does not remain as a part of the transmitter output. Thus, such first RF, or deleted carrier frequency can be selected for convenience and for best results with the post filter addition RF frequency available from the basic AM transmit oscillator 22 of the AM transmitter, permitting use in the single side band mode of the AM transmitter RF strip 15 without compromising single side band transmission quality.

MODIFICATIONS

Figure 3:
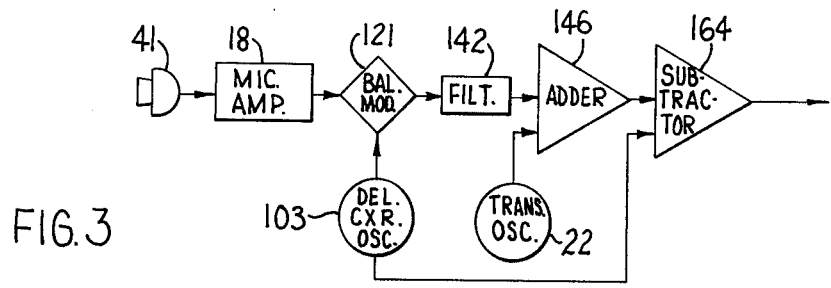
FIG. 3 is a block diagram of a deleted carrier single side band generator, of filtering type, according to the present invention.

For convenience of reference, FIG. 3 discloses in block diagram form, apparatus substantially corresponding to that discussed above in detail with respect to FIGS. 1 and 2. Accordingly, FIG. 3 requires no further comment.

Figure 4:
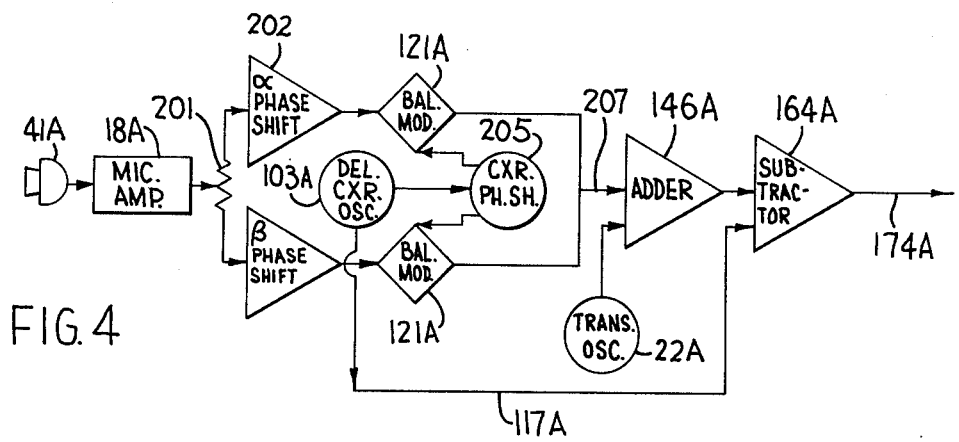
FIG. 4 is a block diagram of a deleted carrier single side band generator, of phasing type, embodying the invention.

FIG. 4 discloses a modification, more particularly a single side band generator which is of phasing type which embodies the present invention. More particularly, a suitable microphone 41A and microphone amplifier 18A drive a phase shift unit, here shown as including a voltage divider 201 coupling the output of the amplifier 18A to inputs of each of a pair of phase shift amplifiers 202 and 203 which in a conventional manner provide a 90° phase shift between the audio signals applied to balanced modulators 121A and 121A'. A deleted carrier oscillator 103A operates through a carrier phase shifter 205 to apply RF signals, at the deleted carrier frequency but with a 90° phase difference with respect to each other, to the RF inputs of the balanced modulators 121A and 121A', respectively. The relative phases of the side bands generated in the balanced modulators are such that one side band is balanced out and the other is included in the combined output of the balanced modulators 121A and 121A' at 207, where the resulting single side band signal at the carrier frequency of oscillator 103A is applied to one input of the add mixer 146A, which at its RF input also receives the second RF frequency signal from the second oscillator 22A. The resulting single side band sum RF frequency (e.g. a nominal 18.2 MHz signal) is applied to one input of a subtract mixer 164A to the subtract input of which is applied the output of aforementioned deleted carrier oscillator 103A through line 117A, so as to delete the first carrier frequency from the sum single side band signal and thereby produce a single side band signal at the frequency of oscillator 22A on the output line 174A, which line may be tied to suitable transmitter output circuitry and an antenna or landline or the like, as with line 174 of above-discussed FIG. 2. Portions of the FIG. 4 embodiment which may correspond to the above-discussed embodiment of FIGS. 1 and 2 carry the same reference numerals with the suffix A or A' added thereto.

Figure 5:
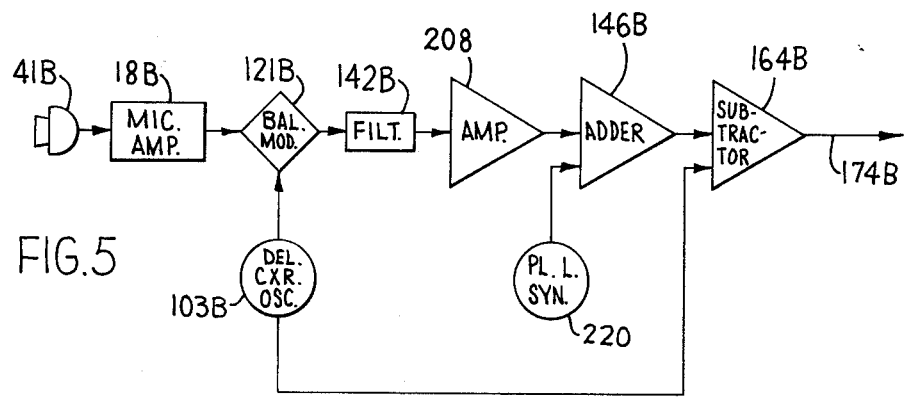
FIG. 5 is a block diagram of a further deleted carrier side band generator according to the present invention using a phase locked loop synthesizer.

The further modification of FIG. 5 is intended to illustrate that RF sources other than those above-discussed may be employed in the present invention, for example a phase locked loop synthesizer may be employed as indicated at 220. Thus, in FIG. 5 the initial portion of the side band circuitry, at 41B, 18B, 121B, 103B and 142B, may be similar to correspondingly numbered parts (minus the suffix B) of FIGS. 1 and 2 above-discussed. Here, the output of single side band filter 142B is applied to an amplifier 208 whose single side band output at the nominal deleted carrier frequency (e.g. about 7.8 MHz) is applied to one input of add mixer 146B, much as above-described, whereas the other input of add mixer 146B is fed by the phase lock loop synthesizer 220 (e.g. at a suitable frequency such as one in the 10.6 MHz frequency range). The single side band sum signal from the add mixer 146B is applied to subtract mixer 164, the deleted carrier frequency (e.g. 718 MHz nominally) being obtained from deleted carrier oscillator 103B and applied to the subtract mixer 164B for subtraction from the sum single side band signal. The result, as before, is a single side band signal at the desired RF frequency (e.g. in the 10.6 MHz range) appearing on output line 174B.

Although particular preferred embodiments of the invention have been disclosed in detail for illustrative purposes, it will be recognized that variations or modifications of the disclosed apparatus, including the rearrangement of parts, lie within the scope of the present invention.

The embodiments of the invention in which an exclusive property or privilege is claimed are defined as follows:

1. A single side band radio transmitter, comprising:
 a first radio frequency signal source means for supplying a first radio frequency carrier signal;
 modulating signal means for supplying an audio frequency modulating signal;
 means including a balanced modulator means for modulating said first radio frequency carrier signal with said modulating signal and therefrom providing a first side band signal;
 second radio frequency signal source means for supplying a second radio frequency signal;
 add mixer means for adding said first side band signal and said second radio frequency signal for providing a higher frequency second side band signal;
 subtract mixer means responsive to said higher frequency second side band signal and to said first radio frequency carrier signal for deleting the latter from the former to produce a third single side band signal substantially at said second radio frequency;
 transmitter output means for providing a transmitter output in response to said third side band signal.

2. The apparatus of claim 1, in which said second radio frequency signal source means is a multiple frequency source actuable for alternately supplying a plurality of second radio frequency signals of different frequency.

3. The device of claim 2, including a synthesizer radio frequency signal source of the multi-frequency type actuable for alternatively supplying a plurality of synthesizer radio frequency signals of different frequency, said transmitter output means including synthesizer mixer means coupled to the output of said synthesizer radio frequency signal source and responsive to signals at said second radio frequency for producing transmitter output frequencies each by arithmetical combination of signals of a said synthesizer radio frequency and a said second radio frequency, wherein the number of available output frequencies substantially exceeds the sum of the number of available synthesizer radio frequencies and second radio frequencies.

4. The device of claim 3, including means for connecting said subtract mixer means to said synthesizer mixer means for supplying the latter with a said third side band signal, wherein said third side band signal is the said signal of second radio frequency to be arithmetically combined with a said synthesizer radio frequency in said synthesizer mixer means and such that the output signal of said transmitter is a fourth single side band frequency.

5. The device of claim 4, wherein said transmitter output means further includes an output linear amplifier means driven by said synthesizer mixer means for in turn producing said transmitter output.

6. The device of claim 5, in which said transmitter further includes an AM transmission portion for transmitting amplitude modulated signals alternately of single side band signals, said AM transmission portion including AM modulator means and sharing with the single side band portion of said transmitter at least parts of said modulating signal means, said second radio frequency source means, said synthesizer radio frequency signal source, said synthesizer mixer means and said output linear amplifier means.

7. The device of claim 6, including means actuable to place said transmitter in AM transmit mode by coupling inputs of said synthesizer mixer means to said second radio frequency signal source means and synthesizer radio frequency signal source with the output of said synthesizer mixer means coupled to said output linear amplifier means to provide the AM carrier frequency, and by further coupling said modulating signal means through said AM modulator means to said output linear amplifier means for modulating said AM carrier frequency.

8. The apparatus of claim 1, in which said first radio frequency signal source means comprises a deleted carrier oscillator having means for alternatively selecting upper and lower first radio frequency carrier signals, said transmitter further including a band pass filter coupling said balanced modulator means to said add mixer means and having a band pass substantially between said upper and lower first radio frequency carrier signals for passing on to said add mixer only the lower side band of said upper first radio frequency carrier or, alternatively, the upper side band of said lower first radio frequency carrier.

9. The device of claim 1, in which said first radio frequency signal source means is a deleted carrier oscillator, and including means connecting the output of said deleted carrier oscillator both to said balanced modulator means and to said subtract mixer means for supplying said first radio frequency carrier signal to the latter.

10. The device of claim 9, including a band pass filter interposed between said balanced modulator means and said add mixer means for eliminating one of the two side band signals generated by said balanced modulator means.

11. The device of claim 10, in which said transmitter includes a pair of said balanced modulator means and a pair of phase shift means each coupling said modulating signal means with a respective one of said pair of balanced modulator means, said transmitter further including a carrier phase shift interposed between the output of said first radio frequency signal source means and each of said balanced modulator means, and means applying the outputs of both said balanced modulator means to said add mixer means.

12. The device of claim 1, including means interposed between said balanced modulator means and said add mixer means for providing said first radio frequency carrier signal to said subtract mixer means, and wherein said second radio frequency signal source is a phase lock loop synthesizer.

13. An amplitude modulated radio transmitter including a basic transmit frequency oscillator for generating a basic transmission frequency, a synthesizer frequency oscillator for generating a synthesizer frequency, an AM transmission mixer coupled to said basic transmit frequency oscillator and said synthesizer frequency oscillator for producing a difference frequency equal to the difference therebetween, a mocrophone and first amplification means and modulator means connected in series for generating an audio frequency amplitude modulating signal, a second amplifier means responsive to said difference frequency and modulating signal for modulating the former with the latter for AM transmission, wherein the improvement comprises:
  a deleted carrier oscillator for generating an initial side band frequency;
  a balanced modulator responsive to said initial side band frequency and to said modulating signal for modulating said initial side band frequency with said modulating signal so as to produce a double side band signal, and further amplifier means for amplifying same;
  filter means responsive to said amplified double side band signal for removing one side band therefrom and leaving a single side band signal;
  an add mixer for producing a single side band sum signal of frequency equal to the basic transmission frequency plus said single side band signal frequency and means actuable to apply said basic transmission frequency to said add mixer instead of to said AM transmission mixer;
  a subtract mixer coupled to said add mixer and deleted carrier oscillator for producing a single side band difference signal at said basic transmission frequency with said initial side band frequency being deleted from said single side band sum signal;
  means actuable for applying said single side band difference signal to said AM transmission mixer in place of said basic transmission frequency and means actuable with said last mentioned means for blocking application of said audio frequency amplitude modulating signal to said second amplifier means.

14. The apparatus of claim 13, in which said deleted carrier oscillator includes means for selecting either an upper side band frequency or lower side band frequency for use as said initial side band frequency, said filter means being tuned to a frequency intermediate said upper and lower side band frequencies so as to pass on the one of said double side band signals closest to said intermediate frequency such that said passed on signal is said single side band signal.

15. The apparatus of claim 14, in which said synthesizer frequency oscillator includes a plurality of alternatively selectable frequency determining elements each selectable for providing a different synthesizer frequency, said basic transmission frequency oscillator including several alternatively selectable frequency determining elements selectable to provide different basic transmit frequencies, such that by selection of the different synthesizer frequencies and basic transmit frequencies, a substantial number of difference frequencies, in excess of the sum of the number of basic transmit frequencies and synthesizer frequencies, are available for AM carrier use, the improvement for single side band transmission requiring only two additional frequency determining elements, said two additional frequency determining elements being the upper and lower side band frequency selecting means of said deleted carrier oscillator, whereby said additional two frequency determining elements in effect triple the number of transmission channels available through AM transmission alone by adding thereto a corresponding quantity of upper side band channels and a corresponding quantity of lower side band channels.

* * * * *